(12) United States Patent
Oga

(10) Patent No.: US 6,459,341 B1
(45) Date of Patent: Oct. 1, 2002

(54) VOLTAGE CONTROLLED OSCILLATION DEVICE

(75) Inventor: Toshiyuki Oga, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/697,507

(22) Filed: Oct. 27, 2000

(30) Foreign Application Priority Data

Oct. 27, 1999 (JP) .......................................... 11-305404

(51) Int. Cl.$^7$ ................................................. H03B 21/00
(52) U.S. Cl. ............................ 331/37; 331/40; 331/49; 331/77; 331/96; 455/318
(58) Field of Search .............................. 331/37–40, 46, 331/49, 76, 77, 96, 107 DP, 107 SL, 117 R, 117 FE, 117 D, 177 V; 455/318, 319–322

(56) References Cited

U.S. PATENT DOCUMENTS

| | | | | |
|---|---|---|---|---|
| 4,791,377 A | * | 12/1988 | Grandfield et al. ............ | 328/14 |
| 5,497,128 A | * | 3/1996 | Sasaki .......................... | 331/38 |
| 5,508,661 A | * | 4/1996 | Keane et al. .................. | 331/37 |
| 6,114,987 A | * | 9/2000 | Bjornholt .................... | 342/200 |
| 6,133,795 A | * | 10/2000 | Williams ...................... | 331/9 |

* cited by examiner

*Primary Examiner*—David Mis
(74) *Attorney, Agent, or Firm*—Young & Thompson

(57) ABSTRACT

A voltage controlled oscillation device includes a voltage controlled oscillator, fixed-frequency oscillator, frequency mixer, and frequency selector. The voltage controlled oscillator changes the output signal frequency in the microwave band in accordance with the input voltage of a frequency control signal. The fixed-frequency oscillator has a fixed oscillation frequency higher than that of the voltage controlled oscillator. The frequency mixer mixes the output signal from the fixed-frequency oscillator and the output signal from the voltage controlled oscillator and outputs the sum frequency and difference frequency between the two signals. The frequency selector selects and outputs one of the sum frequency and difference frequency contained in the output signal from the frequency mixer.

8 Claims, 3 Drawing Sheets

VOLTAGE CONTROLLED OSCILLATION DEVICE

BACKGROUND OF THE INVENTION

The present invention relates to a voltage controlled oscillation device and, more particularly, to a voltage controlled oscillation device which can be suitably applied to a PLL (Phase Locked Loop) circuit of a microwave communication device.

In recent years, large-capacity data communications using microwave communication channels have been executed between even compact terminal apparatuses. Accordingly, use of multilevel transmission signals have been promoted in order to effectively use the radio wave resources.

Multilevel radio transmission signals readily cause transmission errors due to the influence of phase noise. For transmission apparatuses for transmitting multilevel radio signals, the phase noise of a local oscillator in a frequency converter is required to be reduced to improve the transmission quality. In addition, to effectively use free frequency channels, a local oscillator is required to allow its oscillation frequency to change over a wider frequency band.

A fixed-frequency oscillator or a voltage controlled oscillator capable of controlling the frequency in accordance with an external control voltage is generally used as a local oscillator. An example of a conventional fixed-frequency low-phase-noise microwave oscillator is a dielectric oscillator using a dielectric resonator. The dielectric oscillator is constituted by an oscillation active element and a dielectric resonator. As a characteristic feature of the dielectric resonator, since the Q factor (Quality factor) is high, phase noise near the carrier of the oscillator output is low.

In the dielectric oscillator, however, the oscillation frequency is determined by the resonance frequency of the dielectric resonator. The resonance frequency of the dielectric resonator readily varies due to the electromagnetic coupling to peripheral elements or a change in temperature. For this reason, the dielectric oscillator has a problem that the oscillation frequency is less stable than, e.g., a quartz oscillator.

An arrangement has been proposed in which the output signal from a voltage controlled oscillator is synchronized with an oscillator such as a quartz oscillator having a stable frequency using a PLL circuit, thereby improving the stability of oscillation frequency. The voltage controlled oscillator in this arrangement is generally constituted by an oscillation active element, a resonator, and a varactor diode coupled to the resonator. In this arrangement, the reverse bias voltage of the varactor diode is controlled to change the reactance, thereby controlling the output frequency of the oscillator.

In the voltage controlled oscillator with the above arrangement, since the phase noise can be made low as the Q factor of the resonator becomes high, a dielectric resonator is often used in a microwave oscillator. An example is a voltage controlled oscillator disclosed in Japanese Patent Laid-Open No. 9-191215 (reference 1). The voltage controlled oscillator described in reference 1 comprises a tuning circuit section capable of changing the tuning frequency, an oscillator section, and a high-pass filter inserted therebetween.

The oscillator section is designed to have a capacitive input impedance in its oscillation frequency band. The high-pass filter on the input side is designed to conversely cause a phase lead, thereby compensating for the capacitive input impedance of the oscillator section. With this arrangement, a voltage controlled oscillator which suppresses the shift between the oscillation frequency and the resonance frequency of the dielectric resonator and can change the oscillation frequency is obtained.

It is also important for a voltage controlled oscillator to ensure a wide frequency variable band. As a means for widening the oscillation frequency variable band, a structure which strengthens coupling between the resonator and the varactor diode is generally employed. However, since the Q factor of the varactor diode is not high, the total Q factor becomes low as the coupling to the resonator is strengthened, resulting in degradation in phase noise characteristic near the carrier. When the Q factor of the resonator is made high in order to improve the phase noise characteristic, the frequency variable band becomes narrow, resulting in difficulty in widening the frequency band.

Since the voltage controlled oscillator disclosed in reference 1 employs the arrangement for controlling the oscillation frequency using the varactor diode, the low phase noise and wide frequency variable band cannot be simultaneously realized, as described above. The low phase noise and wide frequency variable band in the voltage controlled oscillator have tradeoff relationships and can hardly be simultaneously realized.

To simultaneously realize the low phase noise and wide frequency variable band in the voltage controlled oscillator in the microwave band, the following arrangements can be used, though they have problems.

As the first arrangement, a low-phase-noise element such as a quartz oscillator is used as a reference signal source for phase comparison. With this arrangement, the phase noise of the voltage controlled oscillator can be suppressed to the phase noise level of the reference signal source at maximum in a band (loop band) corresponding to a feedback gain of 1 or more in the loop. However, since the phase noise can be suppressed by the loop only in the loop band, the phase noise characteristics cannot be improved in a detuning frequency band falling outside the loop band.

As the second arrangement, a PLL circuit using an integer frequency divider can be used. In this arrangement, however, the phase comparison frequency must be equal to or lower than the minimum settable frequency interval (step frequency) of the output frequency. In addition, the loop band cannot be set beyond the phase comparison frequency. Hence, when the step frequency is low, the phase noise can hardly be suppressed in a wide band by the PLL circuit.

As the third arrangement, a fractional frequency divider or direct digital synthesizer circuit can be combined with a PLL circuit. With this arrangement, a low step frequency and wide loop band can be consistent. However, the circuit of this type generally has a digital calculator which rounds the values at digit positions lower than the significant digit position of a calculation result and therefore always generates a small error. Such small errors are accumulated every time calculation is repeated, and canceled when the magnitude has reached the significant digit position, resulting in a spurious low frequency.

As the fourth arrangement, a method has been proposed in which frequency variations outside the loop band of a PLL are suppressed using a delay detector to reduce the phase noise over a wide band. An example is a frequency synthesizer disclosed in Japanese Patent Laid-Open No. 9-321619 (reference 2). The frequency synthesizer disclosed in reference 2 comprises a delay detector for detecting the delay of the output signal, a phase locked loop (PLL), and a coupling circuit for coupling the output signals to output the control voltage for the voltage controlled oscillator. The coupling circuit comprises a first low-pass filter for a PLL circuit output signal, a high-pass filter for a delay detector output signal, and a second low-pass filter for synthesizing the output signals to generate the control voltage for the voltage controlled oscillator.

With this arrangement, in a high-frequency band where the phase noise suppressing effect by the PLL becomes small, the phase noise suppressing effect is obtained using the delay detector output signal, thereby obtaining the phase noise suppressing effect in a wider band. However, the frequency synthesizer disclosed in reference 2 has a complex circuit arrangement, and therefore, the device undesirably becomes bulky and expensive.

As the fifth arrangement, a multiple PLL circuit in which a plurality of PLLs are combined can be used. However, since this arrangement increases the circuit scale in proportion to the number of loops, the device undesirably becomes bulky and expensive, like the fourth arrangement. In addition, in this arrangement, since a plurality of frequency components are simultaneously processed, a spurious frequency is generated.

As described above, in the conventional voltage controlled oscillator, the low phase noise and wide output frequency variable band have tradeoff relationships and can hardly be simultaneously realized. This is because when coupling between the resonator and the varactor diode is strengthened to widen the output frequency variable band, the total Q factor of the resonator lowers to degrade the phase noise characteristics. Various kinds of arrangements conventionally used have the following problems.

As the first problem, when a low-phase-noise element such as a quartz oscillator is used as a reference signal source for phase comparison, the phase noise characteristics cannot be improved in the detuning frequency band falling outside the loop band. This is because the phase noise can be suppressed by the loop only in the loop band.

As the second problem, when a PLL circuit using an integer frequency divider is used to prevent degradation in phase noise characteristics, a wide loop band can hardly be ensured when the step frequency is made low, so a sufficient phase noise suppressing band cannot be obtained. This is because of the principle of the PLL circuit using the integer frequency divider in which the loop band must be lower than the step frequency.

As the third problem, when a fractional frequency divider or direct digital synthesizer is used in a PLL circuit to widen the phase noise suppressing band, a spurious low frequency is generated. The reason for this is that the fractional frequency divider or direct digital synthesizer uses a digital calculator, and accumulation and cancel of small errors due to rounding of the calculation result of the digital calculator are periodically repeated.

As the fourth problem, when a delay detector is used to widen the phase noise suppressing band, the circuit scale becomes large and complex.

As the fifth problem, when a multiple PLL circuit which combines a plurality of PLLs is used, the circuit scale becomes large and complex in proportion to the number of loops. In addition, since a plurality of frequency components are simultaneously processed, a spurious frequency is generated.

SUMMARY OF THE INVENTION

It is an object of the present invention to provide a voltage controlled oscillation device having low phase noise and a wide output frequency variable band.

It is another object of the present invention to provide a compact and inexpensive voltage controlled oscillation device.

It is still another object of the present invention to provide a voltage controlled oscillation device with a reduced spurious frequency.

In order to achieve the above objects, according to the present invention, there is provided a voltage controlled oscillation device comprising voltage controlled oscillation means for changing an output signal frequency in a microwave band in accordance with an input voltage of a frequency control signal, fixed-frequency oscillation means having a fixed oscillation frequency higher than that of the voltage controlled oscillation means, frequency mixing means for mixing an output signal from the fixed-frequency oscillation means and an output signal from the voltage controlled oscillation means and outputting a sum frequency and difference frequency between the two signals, and frequency selection means for selecting and outputting one of the sum frequency and difference frequency contained in the output signal from the frequency mixing means.

DESCRIPTION OF THE PREFERRED EMBODIMENTS

The present invention will be described below in detail with reference to the accompanying drawings.

Figure 1:
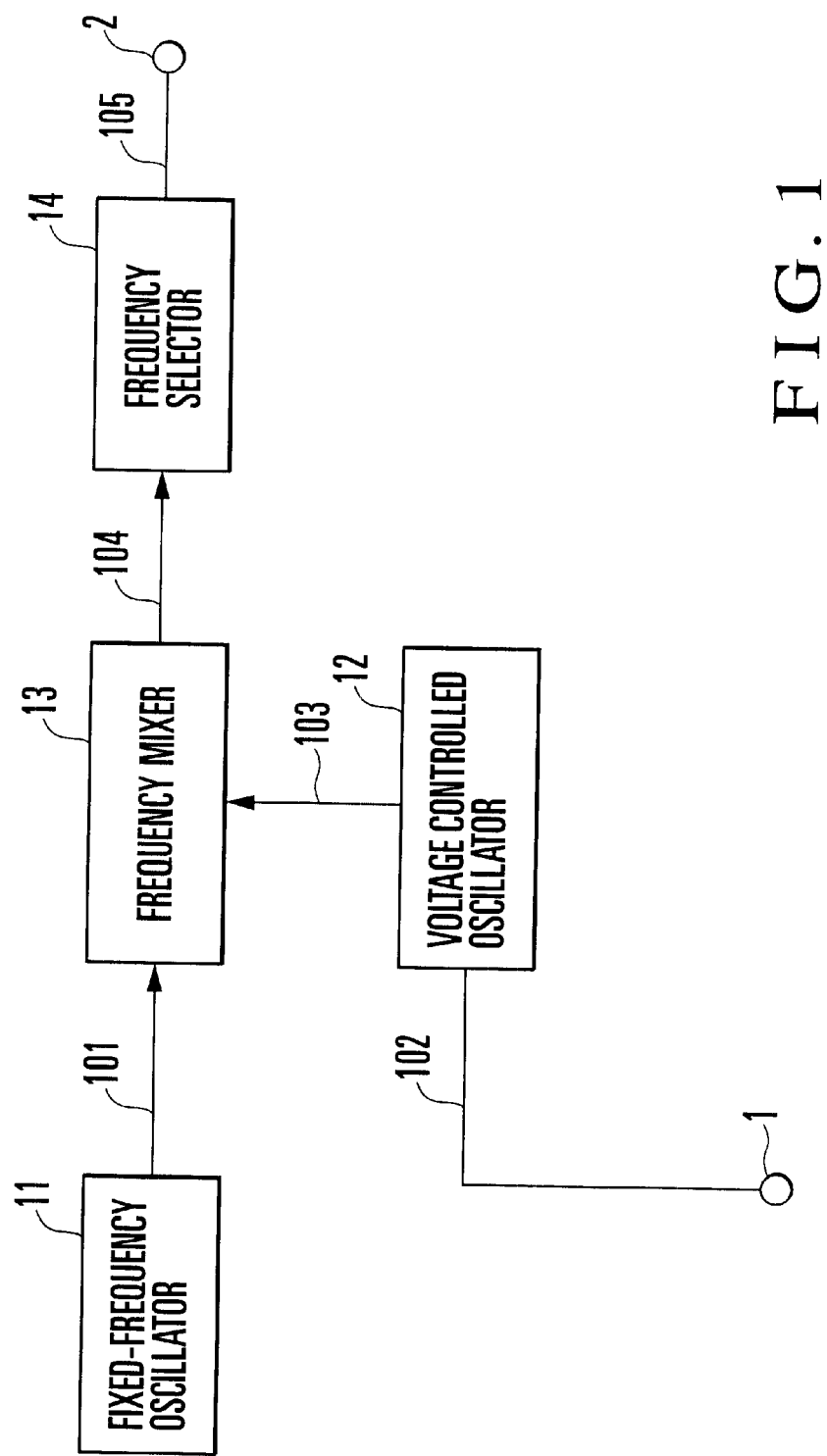
FIG. 1 is a block diagram showing a voltage controlled oscillator according to the first embodiment of the present invention.

FIG. 1 shows a voltage controlled oscillator according to the first embodiment of the present invention. Referring to FIG. 1, the voltage controlled oscillator of this embodiment comprises a low-phase-noise fixed-frequency oscillator 11 whose output frequency is in the microwave band, a voltage controlled oscillator 12 connected to a control voltage input terminal 1, a frequency mixer 13 formed from a mixer for receiving the outputs from the fixed-frequency oscillator 11 and voltage controlled oscillator 12, and a frequency selector 14 for receiving the output from the frequency mixer 13.

The fixed-frequency oscillator 11 generates a fixed-frequency signal 101. Since the fixed-frequency oscillator 11 has no component for externally controlling the frequency, the fixed-frequency signal 101 has lower phase noise as compared to an output signal from a voltage controlled oscillator for generating the same frequency. More specifically, the fixed-frequency oscillator 11 can be constructed using a dielectric oscillator using a dielectric resonator.

The voltage controlled oscillator 12 generates a variable frequency signal 103 in accordance with a frequency control signal 102 input to the control voltage input terminal 1. The frequency of the variable frequency signal 103 is set to be lower than that of the fixed-frequency signal 101. For this reason, even when the output frequency is changed over a wide band, the phase noise can be suppressed. More specifically, the voltage controlled oscillator 12 can be constructed using a microstripline voltage controlled oscillator using a microstripline resonator.

The frequency mixer 13 mixes the fixed-frequency signal 101 from the fixed-frequency oscillator 11 and the variable frequency signal 103 from the voltage controlled oscillator 12 and outputs a signal. An output signal 104 from the frequency mixer 13 contains the sum frequency component and difference frequency component between the fixed-frequency signal 101 and variable frequency signal 103.

The frequency selector 14 selects a desired frequency component of the sum frequency component and difference frequency component contained in the output signal 104 from the frequency mixer 13 and outputs an output signal 105 to a signal output terminal 2. The reason why the output frequency band can be widened while suppressing the phase noise low will be described below in more detail.

The dielectric oscillator exemplified as the fixed-frequency oscillator 11 shown in FIG. 1 and the microstripline voltage controlled oscillator exemplified as the voltage controlled oscillator 12 are known well by those skilled in the art. A case wherein a center frequency of 12.5 [GHz] of the output signal 105 is obtained using, as examples of oscillation frequencies of these devices, a dielectric oscillator having an oscillation frequency of 11 [GHz] as the fixed-frequency oscillator 11 and a microstripline voltage controlled oscillator having an oscillation frequency of 1.5 [GHz] as the voltage controlled oscillator 12 will be described.

The frequency mixer 13 uses a microwave band mixer, and the frequency selector 14 uses a filter, both of which are known well by those skilled in the art, and a detailed description thereof will be omitted.

The output signal from the dielectric oscillator having an oscillation frequency of 11 [GHz], which has a sufficiently low phase noise level, is widely supplied for the application purpose of a microwave band local oscillator for performing data communication using multilevel radio signals. On the other hand, since the microstripline voltage controlled oscillator having an oscillation frequency of 1.5 [GHz] can change its oscillation frequency, the phase noise level is higher than that of, e.g., a dielectric oscillator having an oscillation frequency of 1.5 [GHz].

However, many such microstripline voltage controlled oscillators have been supplied, which have an oscillation frequency variable band from about 100 [MHz] to 200 [MHz] within the phase noise level range allowable for the application purpose of the microwave band local oscillator for performing data communication using multilevel radio signals.

The frequency mixer 13 shown in FIG. 1 mixes the output signal 101 from the fixed-frequency oscillator 11 and the output signal 103 from the voltage controlled oscillator 12 and outputs the sum frequency component and difference frequency component. For this reason, the output signal 104 contains signals with frequencies of 12.5 [GHz] and 9.5 [GHz]. When the sum frequency component is selected by the frequency selector 14, the signal having a frequency of 12.5 [GHz] is obtained from the output terminal 2.

When the output signal from the voltage controlled oscillator 12 is changed 200 [MHz] with respect to 1.5 [GHz] by controlling the frequency control signal 102 input to the control voltage input terminal 1, this change in frequency is directly reflected to the frequency of the output signal 105. More specifically, the frequency of the output signal 105 from the output terminal 2 can be changed in a wide band of 200 [MHz] with respect to 12.5 [GHz] by changing the frequency control signal 102 input to the control voltage input terminal 1.

As described above, the oscillator shown in FIG. 1 constitutes a voltage controlled oscillator whose output signal 105 is changed in the wide band of 200 [MHz] with respect to 12.5 [GHz] as a whole. A dielectric voltage controlled oscillator having an oscillation frequency of 12.5 [GHz] has also generally been provided as a voltage controlled oscillator.

However, the output frequency variable bandwidth of the dielectric voltage controlled oscillator having an oscillation frequency of 12.5 [GHz] is as narrow as 5 [MHz] to 10 [MHz], so the oscillation frequency variable band is not sufficient. This is because the dielectric resonator in the dielectric voltage controlled oscillator has a high Q factor, and it is therefore difficult to change the resonance frequency by an external varactor diode or the like in the same manner as in a microstripline resonator.

The phase noise level of the dielectric voltage controlled oscillator having an oscillation frequency of 12.5 [MHz] is higher than that of a fixed-frequency oscillator using the same dielectric resonator. This is because since an element having a low Q factor is coupled to the resonator, the total Q factor lowers, and the phase noise level rises.

As another example of the voltage controlled oscillator, a microstripline voltage controlled oscillator having an oscillation frequency of 12.5 [GHz] has also generally been provided. However, the phase noise level of the microstripline voltage controlled oscillator having an oscillation frequency of 12.5 [GHz] is higher than that of the dielectric voltage controlled oscillator by about 10 [dB]. This is because the Q factor of the microstripline resonator in the microstripline voltage controlled oscillator is lower than that of the dielectric resonator. More specifically, when the oscillation frequency becomes high, the influence of noise generated by the oscillation active element generally becomes large, and as the Q factor of the resonator increases, the phase noise level due to its influence becomes high.

According to the voltage controlled oscillator of the present invention, an arrangement is employed, in which the output signal from the fixed-frequency oscillator having a high oscillation frequency and low phase noise level and the output signal from the voltage controlled oscillator having a low output frequency and wide output frequency variable band are mixed, and a necessary frequency wave is selected and output. Thus, a low-phase-noise output signal and a wide output frequency variable band are simultaneously attained.

Figure 2:
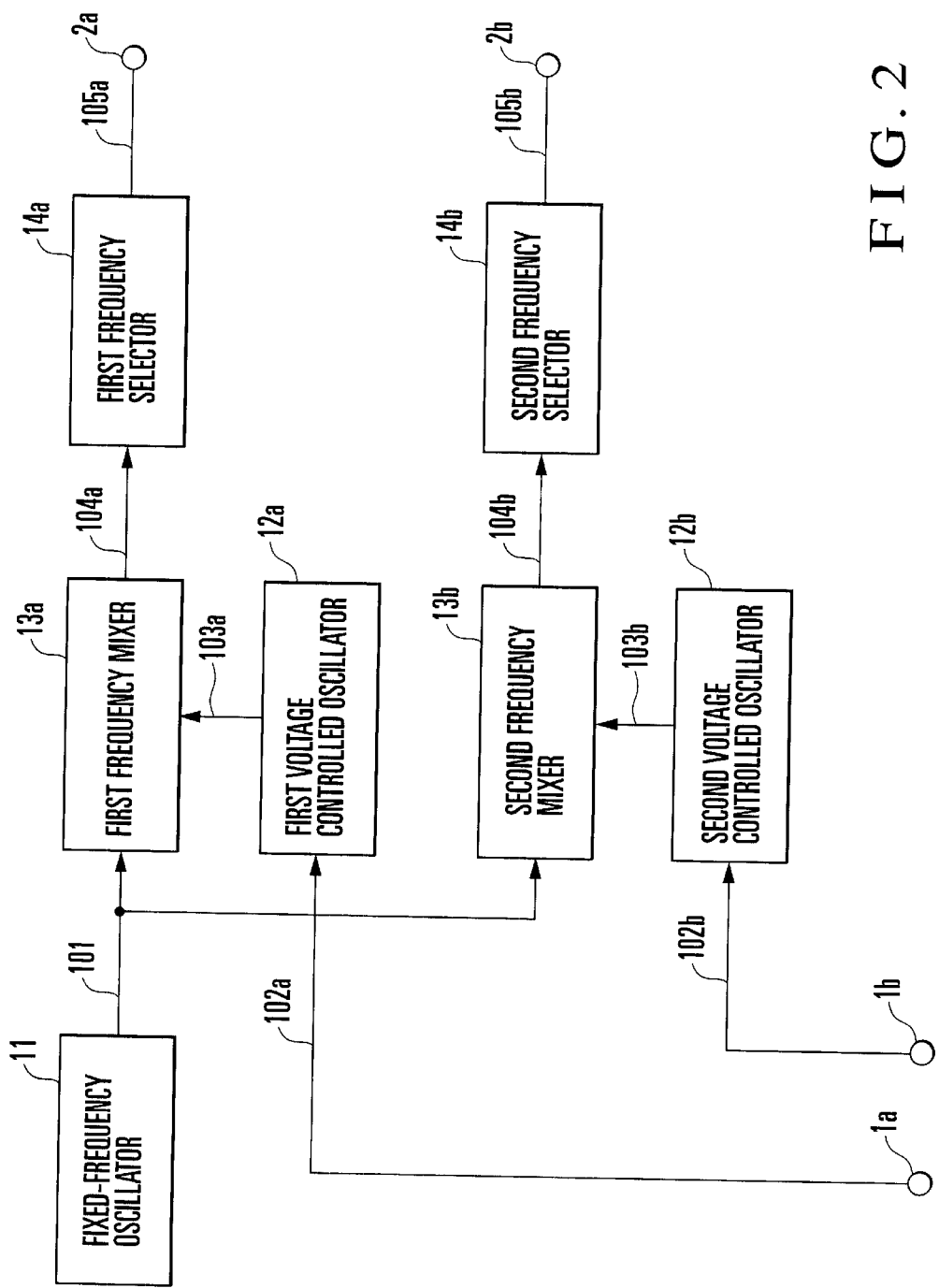
FIG. 2 is a block diagram showing a voltage controlled oscillator according to the second embodiment of the present invention.

FIG. 2 shows a voltage controlled oscillator according to the second embodiment of the present invention. In this embodiment, small-scale circuits are added to the basic arrangement of the first embodiment, thereby obtaining a puerility of output signals.

The voltage controlled oscillator shown in FIG. 2 comprises a low-phase-noise fixed-frequency oscillator 11 whose output frequency is in the microwave band, a first voltage controlled oscillator 12a connected to a control voltage input terminal 1a, a second voltage controlled oscillator 12b connected to a control voltage input terminal 1b, a first frequency mixer 13a for receiving the outputs from the fixed-frequency oscillator 11 and voltage controlled oscillator 12a, a second frequency mixer 13b for receiving the outputs from the fixed-frequency oscillator 11 and second voltage controlled oscillator 12b, a first frequency selector 14a for receiving the output from the frequency mixer 13a, and a second frequency selector 14b for receiving the output from the frequency mixer 13b.

The voltage controlled oscillators 12a and 12b output output signals 103a and 103b in accordance with control voltages 102a and 102b input from the control voltage input terminals 1a and 1b, respectively. The output signals 103a and 103b are input to the frequency mixers 13a and 13b and mixed with an output signal 101 from the fixed-frequency oscillator 11.

The frequency mixers 13a and 13b generate output signals 104a and 104b, each containing a sum frequency component and difference frequency component, and output them to the frequency selectors 14a and 14b, respectively. The frequency selectors 14a and 14b select desired frequency components contained in the output signals 104a and 104b from the frequency mixers 13a and 13b and output output signals 105a and 105b to signal output terminals 2a and 2b, respectively.

According to this embodiment, a voltage controlled oscillator which can obtain a plurality of output signals with a small-scale circuit arrangement and reduce cost by decreasing the number of expensive dielectric oscillators can be provided. In this embodiment, two output signals 105a and 105b are output. However, an arrangement for outputting three or more output signals can also be employed.

Figure 3:
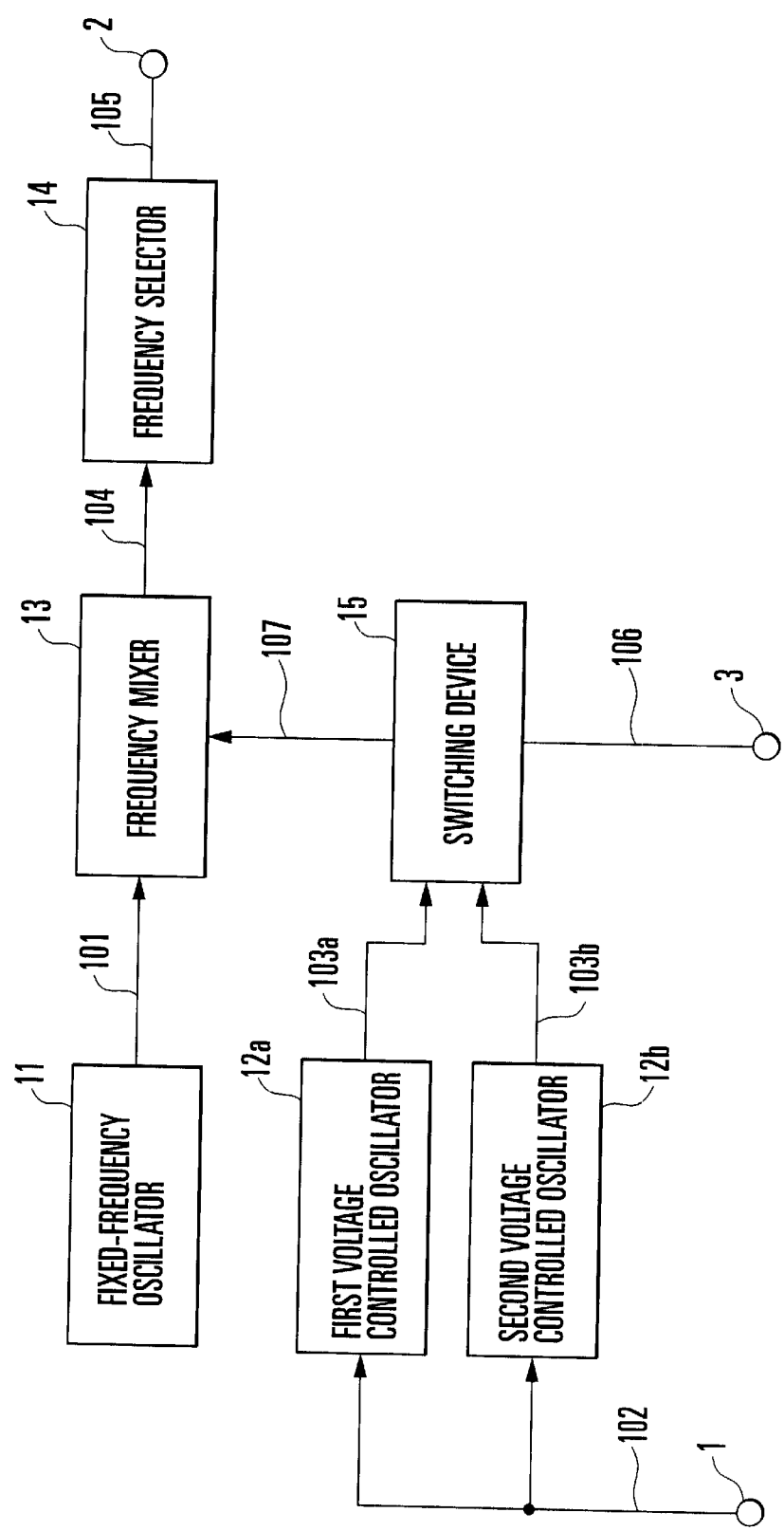
FIG. 3 is a block diagram showing a voltage controlled oscillator according to the third embodiment of the present invention.

FIG. 3 shows a voltage controlled oscillator according to the third embodiment of the present invention. In this embodiment, the arrangement of the first embodiment is further improved to widen the output signal frequency variable band.

The voltage controlled oscillator shown in FIG. 3 comprises a low-phase-noise fixed-frequency oscillator 11 whose output frequency is in the microwave band, first and second voltage controlled oscillators 12a and 12b connected to a control voltage input terminal 1, a switching device 15 which is connected to a switching signal input terminal 3 and receives the outputs from the voltage controlled oscillators 12a and 12b, a frequency mixer 13 for receiving the outputs from the fixed-frequency oscillator 11 and switching device 15, and a frequency selector 14 for receiving the output from the frequency mixer 13.

The voltage controlled oscillators 12a and 12b output output signals 103a and 103b, respectively, in accordance with a control voltage 102 input to the control voltage input terminal 1. The switching device 15 receives the two output signals 103a and 103b from the voltage controlled oscillators 12a and 12b, selects one of the input signals in accordance with a switching control signal 106 input from the switching signal input terminal 3, and outputs the signal as an output signal 107.

The frequency mixer 13 mixes an output signal 101 from the fixed-frequency oscillator 11 with the output signal 107 from the switching device 15 and outputs an output signal 104. The output signal 104 from the frequency mixer 13 contains the sum frequency component and difference frequency component between the two input signals. The frequency selector 14 selects a desired frequency component from the output signal 104 from the frequency mixer 13 and outputs an output signal 105 to a signal output terminal 2.

According to this embodiment, adjacent output frequency bands can be individually set for the voltage controlled oscillators 12a and 12b. For this reason, when the switching device 15 is switched as needed, a wider output band than the individual frequency variable bands of the voltage controlled oscillators 12a and 12b can easily be obtained.

In this embodiment, output signals from two voltage controlled oscillators are switched. However, an arrangement for switching output signals from three or more voltage controlled oscillators can also be employed as needed.

As has been described above, according to the present invention, the output signal from the fixed-frequency oscillator having a high oscillation frequency and low phase noise level and the output signal from the voltage controlled oscillator having a low oscillation frequency and wide output frequency variable band are mixed, and a necessary frequency wave is selected and output. Hence, a voltage controlled oscillator which has a wide output frequency variable band while suppressing the phase noise can be provided.

In addition, since a simple arrangement using elements well-known to those skilled in the art is employed, the device can easily be made compact and inexpensive. When a small-scale arrangement is added, a voltage controlled oscillator capable of simultaneously obtaining output signals of a plurality of kinds can be provided.

Furthermore, when a small-scale arrangement is added, a voltage controlled oscillator having a wider output frequency variable band can be provided. The voltage controlled oscillator according to the present invention has sufficiently low phase noise and therefore requires no arrangement for suppressing the phase noise. Hence, the problem of the spurious frequency generated by the phase noise suppressing circuit can be eliminated.

What is claimed is:

1. A voltage controlled oscillation device comprising:
   first and second voltage controlled oscillation means for changing output signal frequencies in a microwave band in accordance with an input voltage of a common frequency control signal;
   switching means for selecting and outputting one of output signals from said first and second voltage controlled oscillation means in accordance with a switching control signal;
   fixed-frequency oscillation means having a fixed oscillation frequency higher than that of said first and second voltage controlled oscillation means;
   frequency mixing means for mixing an output signal from said fixed-frequency oscillation means and an output signal from said switching means and outputting a sum frequency and difference frequency between the two signals; and
   frequency selection means for selecting and outputting one of the sum frequency and difference frequency contained in the output signal from said frequency mixing means.

2. A device according to claim 1, wherein said fixed-frequency oscillation means comprises a dielectric oscillator using a dielectric resonator.

3. A device according to claim 1, wherein each of said first and second voltage controlled oscillation means comprise microstripline voltage controlled oscillators each using a microstripline resonator.

4. A device according to claim 1, wherein the output frequency bands of said first and second voltage controlled oscillation means are set to be adjacent to each other.

5. A voltage controlled oscillation device comprising:
   first and second voltage controlled oscillators, both of the first and second voltage controlled oscillators receiving as an input a common frequency control signal, each of the first and second voltage controlled oscillators producing as an output a signal having a frequency in a microwave band based on the common frequency control signal;
   a switch receiving as inputs the outputs of the first and second voltage controlled oscillators and a switching control signal, the switch producing as an output one of the switch inputs based on the switching control signal;

a fixed-frequency oscillator producing as an output a signal having a frequency higher than a frequency of the output of either of the first and second voltage controlled oscillators;

a frequency mixer receiving as inputs the output of the fixed-frequency oscillator and the output of the switch, the frequency mix or producing as an output a sum frequency and a difference frequency with respect to the inputs of the frequency mixer; and a frequency selector receiving as an input the output of the frequency mixer and producing as an output one of the sum frequency and the difference frequency produced by the frequency mixer.

6. The voltage controlled oscillation device of claim 5, wherein the fixed-frequency oscillator comprises a dielectric oscillator using a dielectric resonator.

7. The voltage controlled oscillation device of claim 5, wherein each of the first and second voltage controlled oscillators comprises microstripline voltage controlled oscillators each using a microstripline resonator.

8. The voltage controlled oscillation device of claim 5, wherein the output frequency bands of the first and second voltage controlled oscillators are adjacent to one another.

\* \* \* \* \*